(12) United States Patent
Khan P (10) Patent No.: US 11,764,783 B1
(45) Date of Patent: Sep. 19, 2023

(54) DRIVER FOR MITIGATING HIGH-VOLTAGE SURGES AT HOST AND SINK INTERFACE DEVICES

(71) Applicant: SEMICONDUCTOR COMPONENTS INDUSTRIES, LLC, Phoenix, AZ (US)

(72) Inventor: Athar Ali Khan P, Bangalore (IN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/664,277

(22) Filed: May 20, 2022

(51) Int. Cl.
| | |
|---|---|
| H03K 19/0175 | (2006.01) |
| G06F 13/40 | (2006.01) |
| H03K 17/687 | (2006.01) |
| H02M 3/07 | (2006.01) |
| H04B 1/16 | (2006.01) |

(52) U.S. Cl.
CPC . H03K 19/017509 (2013.01); G06F 13/4072 (2013.01); H02M 3/07 (2013.01); H03K 17/687 (2013.01); H04B 1/16 (2013.01)

(58) Field of Classification Search
CPC .... G06F 13/4072; H02M 3/07; H03K 17/687; H03K 19/0175; H03K 19/017509; H03K 19/017518; H04B 1/16
USPC ........... 326/82, 83, 86, 89, 90; 327/108, 109
See application file for complete search history.

(56) References Cited

U.S. PATENT DOCUMENTS

| | | | |
|---|---|---|---|
| 10,790,794 B1 | 9/2020 | Kahn. P | |
| 2009/0051393 A1* | 2/2009 | Kamenicky | H03F 3/2171 327/108 |
| 2010/0073837 A1 | 3/2010 | Preditetchenski et al. | |
| 2016/0190794 A1 | 6/2016 | Forghani-Zadeh et al. | |
| 2021/0034563 A1 | 2/2021 | Kahn. P et al. | |
| 2021/0091762 A1* | 3/2021 | Garbossa | H03K 17/08122 |

* cited by examiner

*Primary Examiner* — William Hernandez
(74) *Attorney, Agent, or Firm* — Polansky & Associates, P.L.L.C.; Paul J. Polansky; Nathan H. Calvert (57) ABSTRACT

A driver circuit includes an output terminal adapted for driving a data signal through a coupling capacitor to an external device. A first transistor is employed to drive the signal, and an N-type metal-oxide semiconductor (NMOS) transistor couples power to the first transistor. The NMOS transistor includes a first terminal connected to a positive terminal of a voltage supply, a second terminal coupled to an output terminal through a termination resistor, a gate terminal, and a bulk terminal connected to the negative terminal of the voltage supply. A charge pump circuit supplies a voltage to a gate terminal of the NMOS transistor, and is operable to provide a first voltage higher than that of the voltage supply to activate the NMOS device, and, responsive to detecting a ramp-down of the supply voltage, transition to providing the supply voltage to the NMOS device gate terminal.

20 Claims, 7 Drawing Sheets

DRIVER FOR MITIGATING HIGH-VOLTAGE SURGES AT HOST AND SINK INTERFACE DEVICES

FIELD OF THE INVENTION

This disclosure relates generally to electronic communication, and more particularly, to re-drivers for signaling over communication links such as Universal Serial Bus (USB) links.

BACKGROUND

As technology nodes for system-on-chips (SOCs) in laptops, smartphones, and tables became smaller, it became more difficult to support the high voltage levels needed for signaling over cables such as USB cables or DisplayPort' (by Video Electronics Standards Association (VESA)) cables. Re-drivers are circuits that are often used to produce the high voltage levels needed to maintain signal integrity for communication cables, especially at high data rates such as 10 gigabits-per-second (Gbps) or 20 Gbps.

Re-drivers often require a high voltage supply, which can cause voltage surges over the output terminals of the re-driver when the high voltage supply is powered up or powered down. Such voltage surges may deleteriously affect the host or sink devices to which the re-driver is connected. In the past, generally, the host or sink used high voltage transistors at its inputs, and so there was not a significant risk of damage from voltage surges. However, high voltage transistors are costly and use more power, and therefore the industry has transitioned to using lower voltage transistors and lower supply voltages at the host and sink. As the supply voltages of host and sink devices are reduced, for example from a 1.8V supply to a 1.2V or a 1V supply, designing an inexpensive re-driver circuit that can meet the voltage specifications for such hosts and sinks becomes difficult. In particular, the signaling specifications for instantaneous direct-current and alternating-current (DC+AC) voltages at the connector side of AC coupling capacitors, and the specifications for instantaneous DC common mode voltage are difficult to meet for high speed re-drivers in applications such as USB and DisplayPort.

One known solution employs a protection circuit in which a switch in the driver circuitry is connected between a USB port pin and a middle node, and a detection circuit compares the middle node voltage with a reference voltage. This method "clamps" the voltage to a desired level during a surge to offer less impedance at the output terminal and protect the host or sink device from surges. However, this method tends to make automatic detection of cable connections more difficult, and increases the expense and complexity of the re-driver circuit.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

Figure 1:
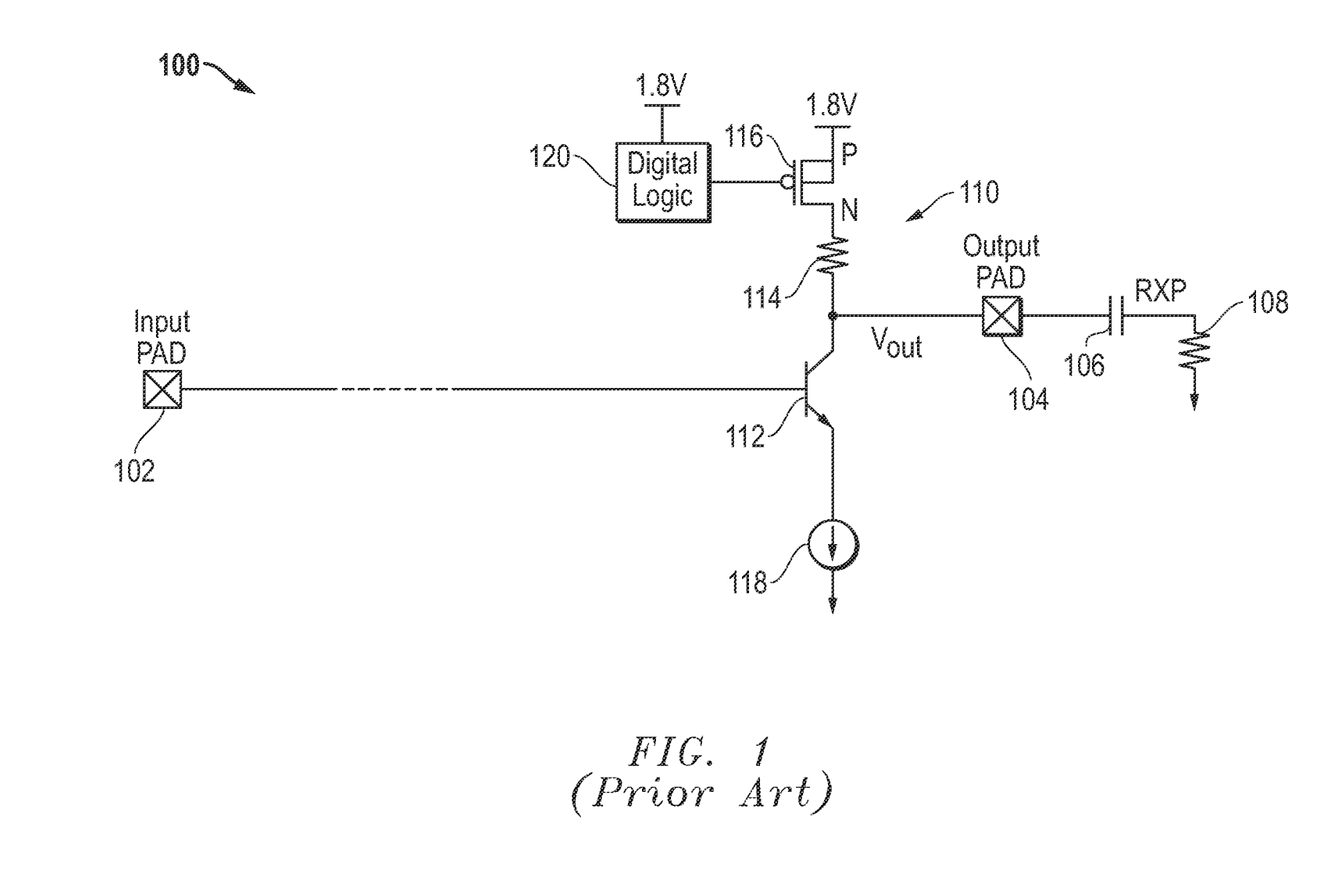
FIG. 1 illustrates in mixed circuit diagram and block diagram form an exemplary system according to the prior art.

FIG. 1 illustrates in mixed circuit diagram and block diagram form a driver circuit 100 according to the prior art. Driver circuit 100 includes a driver 110 and a digital logic circuit 120. Driver 110 has an input connected to an input pad 102, an input connected to digital logic circuit 120, and an output connected to an output pad 104. Output pad 104 is generally an output terminal of an IC, such as a re-driver IC, and provides a data signal labelled "Vout" through a coupling capacitor 106 to an external device, which may be connected over a cable or a PCB trace, backplane, or other suitable conductive structure. A resistor 108 is shown connected to the output terminal, and generally represents the unterminated resistance of the load such as the input terminal of the host or sink device when a termination resistance such as a 50-ohm termination is not activated. Additional circuits such as gain circuits, equalizers, and pre-driver circuits may be connected between input pad 102 and driver 110, as indicated by the dotted lines shown in the connection from input pad 102 to driver 110.

Driver 110 includes a first transistor 112, a termination resistor 114, an P-type metal-oxide semiconductor (PMOS) transistor 116, and a current source 118. PMOS transistor 116 has a first terminal connected to a positive terminal of voltage supply, labeled "1.8V", a second terminal coupled to the output terminal through termination resistor 114, a gate terminal, and a bulk terminal connected to the positive terminal of the voltage supply. First transistor 112, in this embodiment, is an NPN bipolar junction transistor (BJT) with a collector connected to the output terminal, an emitter coupled to a negative terminal of the voltage supply through current source 118, and a base for receiving the data signal. Current source 118 is a constant current source of any suitable type commonly used in BJT drivers, and serves to pull down output voltage Vout when first transistor 112 is activated to drive a "LOW" output. When first transistor 112 is deactivated, output voltage Vout is driven high by PMOS transistor 116 to provide a "HIGH" output. Driver 110, during voltage supply ramp up and especially during voltage supply ramp down, experiences the common mode voltage surge problems discussed above.

Figure 2:
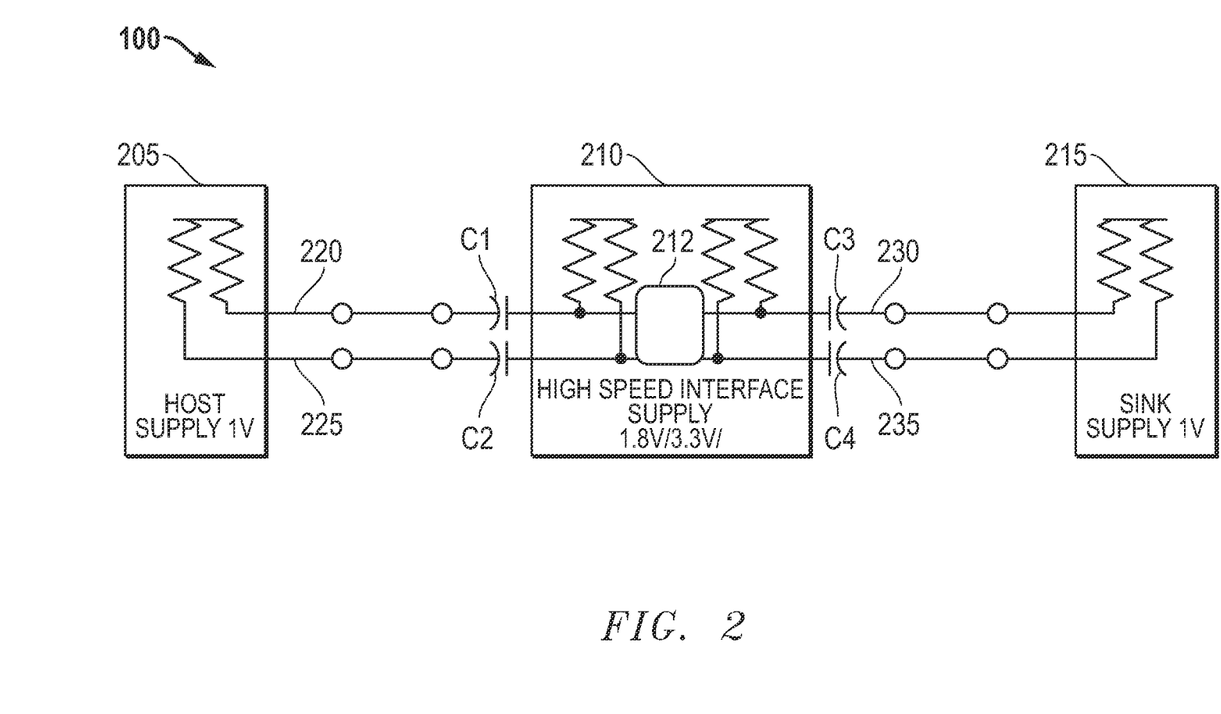
FIG. 2 illustrates in mixed circuit diagram and block diagram form an interface circuit according to the prior art.

FIG. 2 illustrates in mixed circuit diagram and block diagram form an exemplary system 200 according to some embodiments. System 200 includes a host device 205 (i.e., a source device), an interface circuit 210, and a sink device 215. Host device 205 and interface circuit 210 are connected by a transmission line, such as a first transmission line 220 and a second transmission line 225, and a coupling capacitor, such as coupling capacitors C1 and C2. Furthermore, interface circuit 210 and sink device 215 are connected by a transmission line, such as a third transmission line 230 and a fourth transmission line 235, and a coupling capacitor, such as coupling capacitors C3 and C4. Accordingly, host device 205 and sink device 215 are connected to each other via interface circuit 210. Transmission lines 220, 225, 230, and 235 may include any suitable communication lines, buses, links, wires, cables, and the like for transferring data. Host device 205, interface circuit 210, and sink device 210 may also include termination resistors as depicted for terminating the respective connections. The termination resistors may include any suitable resistive element for matching the characteristic impedance of the transmission lines.

Interface circuit 210 may be configured to regenerate signals to boost the quality of the signal transmitted from the host device 205 to the sink device 215. Interface circuit 210 may also be configured to adjust and correct for known channel losses and restore signal integrity.

Interface circuit 210 may selectively bias various terminals to achieve a desired operation and/or improve interoperability between the host device 205 and interface circuit 210. Interface circuit 210 receives or generates a supply voltage VDD.

Interface circuit 210 may be configured to provide a uni-directional channel or a bi-directional channel comprising a re-driver 212 to amplify, compensate for channel loss, and/or apply a desired gain to an input signal. Interface circuit 210 may be implemented as a linear re-driver for multi-protocol applications, such as USB and/or DisplayPort. Host device 205 and sink device 215 are supplied with a low voltage such as the depicted 1V supply in accordance with the current generation of standards for signaling protocols such as USB and DisplayPort, for example. Re-driver 212 is constructed as disclosed below to allow the low voltage drivers to meet the common-mode voltage surge specifications that system 100 (FIG. 1) was unable to meet.

Figure 3:
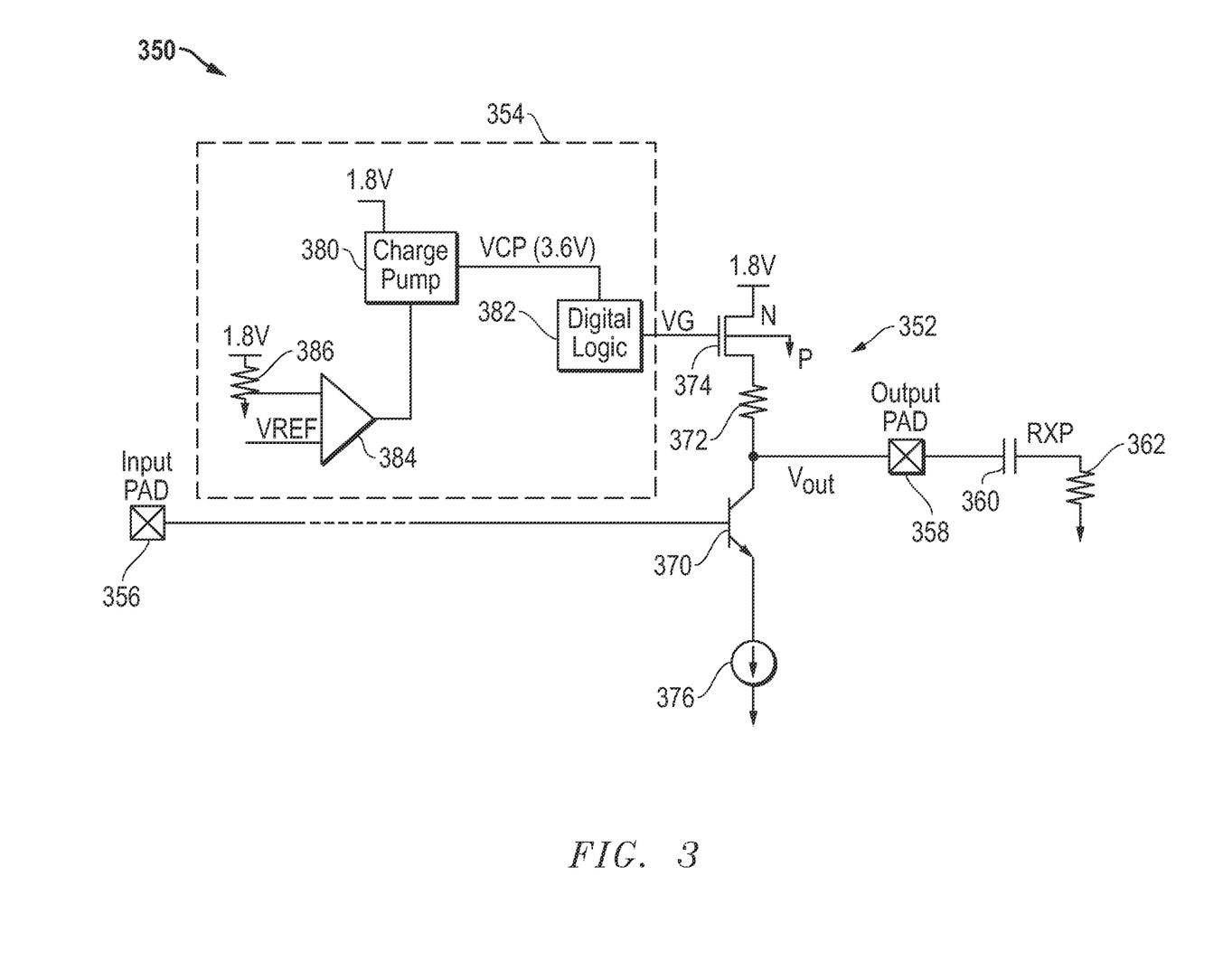
FIG. 3 illustrates in mixed circuit diagram and block diagram form a driver circuit 350 according to some embodiments.

FIG. 3 illustrates in mixed circuit diagram and block diagram form a driver circuit 350 according to some embodiments. Driver circuit 350 is suitable for use in a re-driver, such as those in FIG. 1 and FIG. 2, or in other re-driver circuits for a communication link like a USB link or DisplayPort link. Driver circuit 350 is also suitable for use in other applications for which voltage surges need to be controlled, for example communication links without re-drivers. Generally, driver circuit 300 is adapted to provide digital signaling at a rate of at least 10 Gbps, and more preferably at least 20 Gbps.

Driver circuit 350 includes a driver 352 and a charge pump circuit 354. Driver 352 has an input connected to an input pad 356, an input labelled "VG" receiving a voltage also referred to herein as VG, and an output connected to an output pad 358. Output pad 358 is generally an output terminal of an IC, such as a re-driver IC, and provides a data signal labelled "Vout" through a coupling capacitor 360 to an external device, which may be connected over a cable or a PCB trace, backplane, or other suitable conductive structure. A resistor 362 is shown connected to the output terminal, and generally represents the unterminated resistance of the load such as the input terminal of the host or sink device when a termination resistance such as a 50-ohm termination is not activated. While a single driver 352 is shown, in some embodiments such drivers are implemented as differential pairs with two identical drivers. Further, additional circuits such as gain circuits, equalizers, and pre-driver circuits may be connected between input pad 356 and driver 352, as indicated by the dotted lines shown in the connection from input pad 356 to driver 352.

Driver 352 includes a first transistor 370, a termination resistor 372, an N-type metal-oxide semiconductor (NMOS) transistor 374, and a current source 376. NMOS transistor 374 has a first terminal connected to a positive terminal of voltage supply, labeled "1.8V", a second terminal coupled to the output terminal through termination resistor 372, a gate terminal, and a bulk terminal connected to the negative terminal of the voltage supply. First transistor 370, in this embodiment is an NPN bipolar junction transistor (BJT) with a first terminal connected to the output terminal, a second terminal coupled to a negative terminal of the voltage supply through current source 376, and a third terminal for receiving the data signal. Current source 376 is a constant current source of any suitable type commonly used in BJT drivers, and serves to pull down output voltage Vout when first transistor 370 is activated to drive a "LOW" output. When first transistor 370 is deactivated, while NMOS transistor 374 is conductive, output voltage Vout is driven high by NMOS transistor 374 to provide a "HIGH" output.

Charge pump circuit 354 has an input connected to the 1.8V supply voltage, a second input labeled "VREF" receiving a reference voltage, and an output connected to the gate terminal of NMOS transistor 374. Charge pump circuit 354 includes a charge pump 380, a digital logic circuit 382, a comparator 384, and a resistive voltage divider 386. Generally, charge pump circuit 354 operates in a first active mode to provide a first voltage higher than that of the voltage supply at the output VG to activate NMOS transistor 374 without a threshold voltage drop, and, responsive to detecting a ramp-down of the supply voltage associated with a second non-active mode, transitions to providing the supply voltage to the gate terminal of NMOS transistor 374.

Comparator 384 receives the voltage VREF at one input, receives a voltage from resistive voltage divider 386, proportional to the 1.8V supply voltage, at its other input, and has an output connected to charge pump 380. VREF is such that the comparison threshold at comparator 384 is crossed when the supply voltage drops below 1.5V in this implementation, which indicates a ramp-down, but may be set to another suitable value depending on the supply voltage employed.

Charge pump 380 has an input receiving the supply voltage, an enable input connected to the output of comparator 384, and an output labeled "VCP". Digital logic circuit 382 has an input connected to the output of charge pump 380, and an output connected to the gate of NMOS transistor 374 to provide the voltage VG. Charge pump 380 may be any suitable type of charge pump capable of responding to changes in its supply voltage on a time scale of around 100 microseconds, as further described below with respect to FIG. 6. Suitable charge pump designs are also capable of being enabled and disabled under control of an enable input, and when disabled providing the supply voltage at their output. A single charge pump 354 may supply a VCP for multiple drivers in a re-driver IC.

In operation, when the supply voltage is initialized and ramps up to the 1.8V supply level, for example following a sleep mode for the host driver 205, or following power on, comparator 384 detects when the supply voltage crosses voltage level of VREF. Responsive do this crossing, the output of comparator 384 activates charge pump 380 to begin operation in a first active mode to provide a first voltage higher than that of the voltage supply at the output VCP. Digital logic 382 then drives this higher voltage its output VG to activate NMOS transistor 374. In this implementation, the higher voltage is double the supply voltage, or 3.6V. However, in other implementations, other suitable voltages may be chosen which are sufficient to activate NMOS transistor 374 without causing a VT drop.

NMOS transistor 374, when activated, provides the supply voltage of 1.8V to the rest of driver circuit 352 for driving the signal on input pad 356 to output pad 358. Because the bulk terminal or P-well body of NMOS transistor 374 is connected to ground, the negative rail of the power supply voltage, NMOS transistor 374 provides isolation of the output pad such that common mode voltage spikes do not couple through coupling capacitor 360. When the 1.8V supply voltage is powered off, such as when the re-driver IC goes into a sleep mode, the supply voltage is ramped down, comparator 384 detects when the supply voltage drops beneath VREF. The output of comparator 384 at this point causes charge pump 380 to transition to a second mode in which it outputs only the supply voltage.

Figure 4:
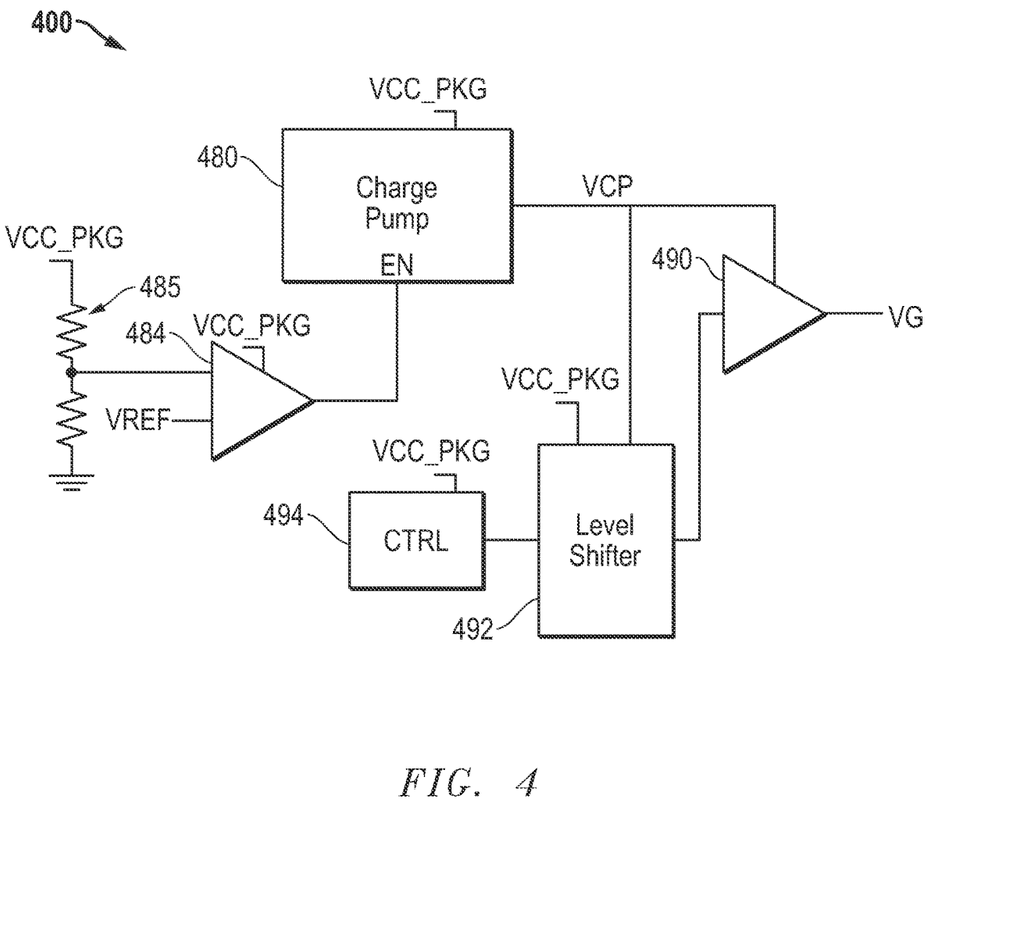
FIG. 4 illustrates in block diagram form an implementation of a charge pump circuit 400 according to some embodiments.

FIG. 4 illustrates in block diagram form an implementation of a charge pump circuit 400 according to some embodiments. Charge pump circuit 400 is suitable for use in driver circuit 300 and other similar driver circuits which need to mitigate common mode voltage surges.

Charge pump circuit 400 has an input connected to a supply voltage labelled "VCC_PKG", a second input labeled "VREF" receiving a reference voltage, and an output labelled "VG" for connecting to the gate terminal of NMOS transistor 374. Charge pump circuit 400 includes a charge pump 480, a comparator 484, a resistive voltage divider 485, a buffer 490, a level shifter 492, and a digital control circuit 494 labelled "CTRL". Generally, charge pump circuit 400 operates similarly to that of FIG. 3, providing a first active mode to provide a first voltage higher than that of the voltage supply at the output VG to activate NMOS transistor 374 with no VT drop, and, responsive to detecting a ramp-down of the supply voltage associated with a second non-active mode, transitions to providing the supply voltage to the gate terminal of NMOS transistor 374 during the ramp down.

Resistive voltage divider 485 is connected between the supply voltage VCC_PKG and ground, and produces a voltage at its center output proportional to the voltage of VCC_PKG. Comparator 484 receives the voltage VREF at one input and the voltage proportional to the supply voltage VCC_PKG at its other input, and has an output connected to an enable input of charge pump 480 labelled "EN". Comparator 484 is also supplied with supply voltage VCC_PKG.

Charge pump 480 has an input receiving the supply voltage VCC_PKG, an enable input connected to the output of comparator 484, and an output labeled "VCP". Level shifter 493 has a first supply input connected to the supply voltage VCC_PKG, a second supply input connected to the charge pump output VCP, an input connected to digital control circuit 494, and an output connected to an input of buffer 490.

Buffer 490 is supplied with the charge pump output voltage VCP, and has an input coupled to digital control circuit 494 through level shifter 494, and an output providing the voltage VG for the gate of NMOS transistor 374. Digital control circuit 494 is supplied with VCC_PKG, and has various other inputs and outputs (not shown) for enabling and controlling other parts of the re-driver IC. Such control signals may be generated internally in a re-driver IC, or received from another IC such as a link controller. Relevant to this disclosure, digital control circuit 494 provides the depicted output to level shifter 492 to determine when NMOS transistor 374 will be activated and deactivated. This output is controlled to be HIGH when the re-driver is in an active mode (i.e., not asleep or powered down or otherwise idled).

In operation, when the re-driver is enabled, the input to level shifter 492 is high, and level shifter 492 shifts the digital signal from the VCC_PKG level to the voltage level of VCP. When charge pump 480 is operating, this level is generally higher than VCC_PKG, in this example 3.6V. Buffer 490 then supplies this signal at its output VG to activate NMOS transistor 374 with no VT drop.

Figure 5:
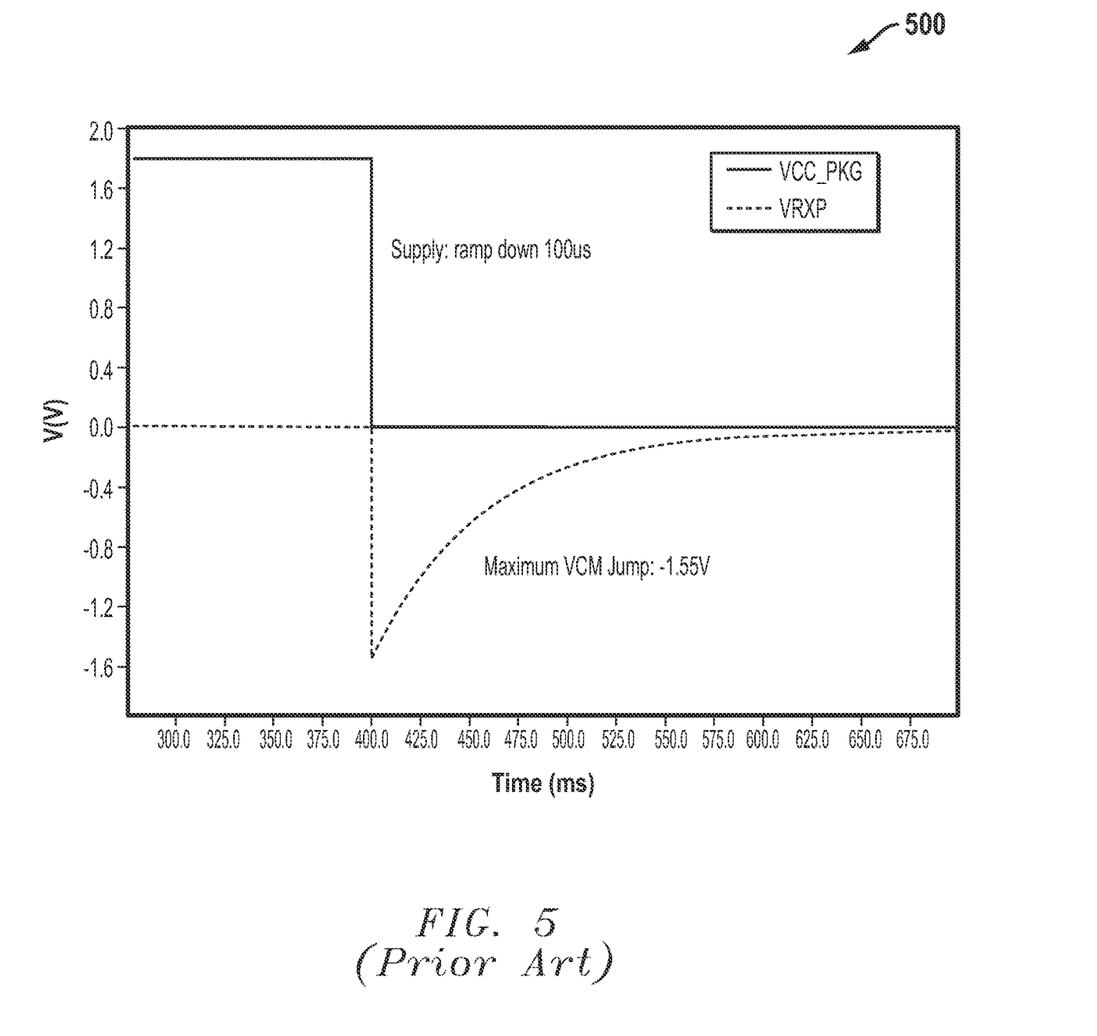
FIG. 5 shows a timing diagram depicting a common mode voltage surge caused by a supply ramp-down in a driver circuit without using the techniques herein.

FIG. 5 shows a timing diagram depicting a common mode voltage surge caused by a supply ramp-down in a driver circuit without using the techniques herein. The vertical axis depicts voltage in volts and the horizontal axis depicts time in milliseconds (ms). The timing diagram shows the supply voltage, labelled "VCC_PKG", and the common mode voltage coupled through coupling capacitor 360, labelled "VRXP".

As depicted, when the supply voltage VCC_PKG ramps down over the course of 100 microseconds, the common mode voltage has a surge to −1.55V that is coupled through the driver's output coupling capacitor. Such a surge is harmful when it is coupled to any low voltage devices in the receiver circuit of a connected IC. A surge of this magnitude, 1.55V, exceeds the specification of the USB 3.1 standard (as modified by engineering change notices) for the instantaneous DC common mode voltage coupled from a transmitter, which provides a "min1" value of is −0.5V and a "min2" value of −0.3V. The min1 values are measured with a receiver-side termination of 200K ohms and the min2 values are measured with a receiver-side termination of 50 ohms. Other current standards such as DisplayPort include similar specifications, which would be violated by the depicted voltage surge phenomenon of FIG. 5.

Figure 6:
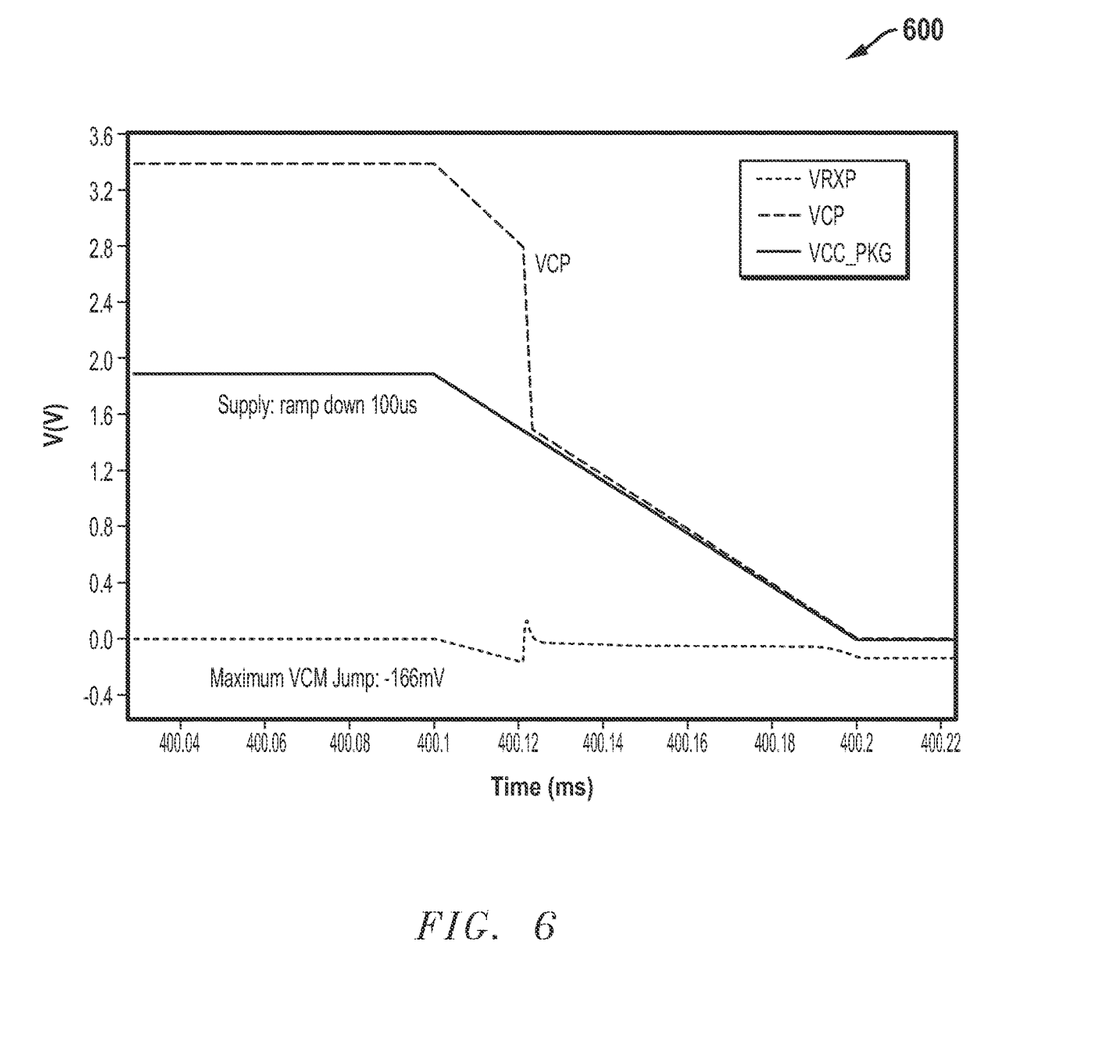
FIG. 6 shows a timing diagram depicting a common mode voltage surge mitigated using a driver circuit with voltage surge protection of FIG. 3.

FIG. 6 shows a timing diagram depicting a common mode voltage surge mitigated using a driver circuit with voltage surge protection as shown in driver circuit 350 (FIG. 3). The vertical axis depicts voltage in volts and the horizontal axis depicts time in ms. The timing diagram shows the supply voltage, labelled "VCC_PKG", the output voltage of charge pump 380 (FIG. 3) labelled "VCP", and the common mode voltage coupled through coupling capacitor 360, labelled "VRXP".

As can be seen, the supply voltage VCC_PKG ramps down over about 100 microseconds, and the charge pump, which in this embodiment is producing double the VCC_PKG, tracks the ramp down at approximately double the voltage of VCC_PKG until VCC_PKG crosses the reference voltage fed to comparator 384. At this point, during the ramp down, the charge pump deactivates and VCP transitions quickly to track VCC_PKG. The common mode voltage VRXP shows a surge to about minus 166 mv, far less magnitude than the surge shown in FIG. 5.

As can be seen, the common mode voltage surge is reduced in magnitude by almost 90%, and is able to meet the specifications of USB 3.1 and other standards designed for use with low voltage devices in receivers. The depicted process allows driver circuit 300 to reduce voltage variations coupled through the coupling capacitor during ramp up and ramp down of the supply voltage at a supply voltage of 1.8V to less than 200 mV.

Figure 7:
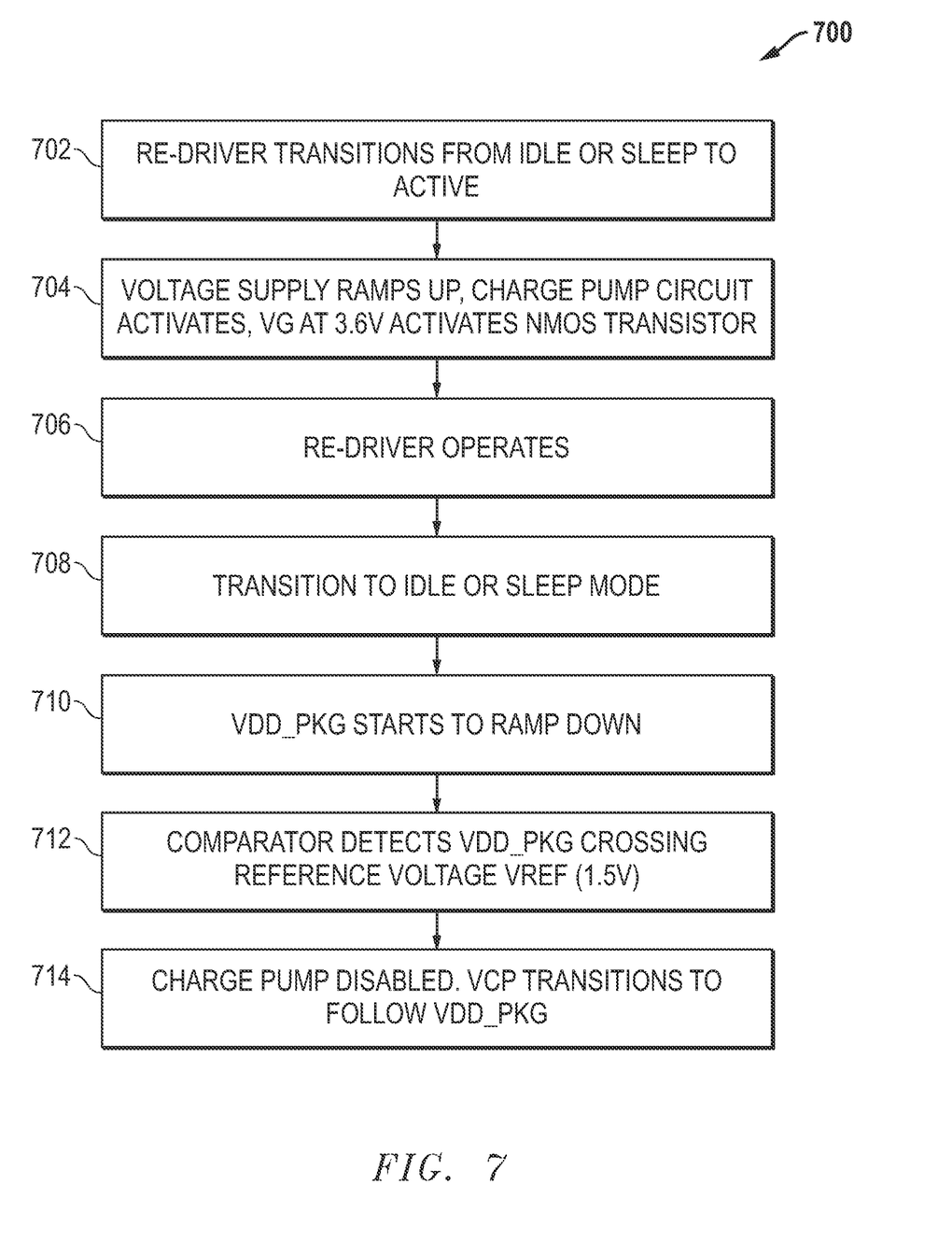
FIG. 7 shows a flowchart of a process for driving a digital signal through a coupling capacitor according to some embodiments.

FIG. 7 shows a flowchart 700 of a process for driving a digital signal through a coupling capacitor according to some embodiments. The process is suitable for implementation with re-drivers or drivers employing the circuit of FIG. 3 or FIG. 4, and other circuit implementations using the techniques described herein, to establish a communication link, typically under control of a link controller such as a USB controller.

At block 702, the re-driver transitions from idle or sleep mode to active, for example when a cable is plugged in to a port such as a USB port or DisplayPort port. Responsive to this transition, as shown at block 704, the power supply ramps up to provide the re-driver circuit with power, and charge pump 380 activates as the supply voltage passes the value of VREF. After the supply voltage passes VREF, the charge pump is in a first active mode, creating a first voltage higher than the supply voltage and applying the first voltage to a gate of NMOS transistor 374 to supply power to the driver.

In this mode, the re-driver operates to drive a digital signal through the driver as shown at block 706. When at a logic high, the signal is driven to the full supply voltage level through first transistor 374 to output pad 358 and through coupling capacitor 360 to an external circuit such as a video display device or USB host or sink device to provide a communication link.

At block 708, the link controller begins transitioning to an idle mode or a sleep mode, which typically occurs when the communication link is idle for a designated period or a cable is unplugged, for example. As part of the transition to idle or sleep mode, the link controller causes the supply voltage VDD_PKG to ramp down, which starts at block 710. During the ramp down, comparator 384 detects that the supply voltage VDD_PKG has dropped below the reference voltage VREF, as shown at block 712. Responsive to this, charge pump is disabled and its output voltage VCP applied to the game of NMOS transistor 374 is transitioned toward the supply voltage. As seen in the timing diagram of FIG. 6, VCP transitions to the supply voltage, but a residual charge in the capacitors of the charge pump causes VCP not to converge immediately to the supply voltage over time period of the ramp down. As depicted in FIG. 6, the transition of VCP is generally faster in volts per microsecond than the supply ramp down, because charge pump 354 has less capacitance than the power supply providing VDD_PKG. Therefore, VCP is able to transition within a few microseconds to a voltage very close to VDD_PKG as VDD_PKG ramps down, allowing NMOS transistor 374 to be deactivated at an earlier point during the ramp down than it would if charge pump 354 were allowed to remain activated in the first mode for the entire ramp down process.

Thus, various embodiments of a re-driver circuit, an apparatus including such a circuit, and a corresponding method have been described. The various embodiments provide for a low-cost yet reliable repeater that provides high signaling rates while still achieving a desired common mode voltage surge specification.

The above-disclosed subject matter is to be considered illustrative, and not restrictive, and the appended claims are intended to cover all such modifications, enhancements, and other embodiments that fall within the true scope of the claims. For example, the driver circuits herein may be used in re-drivers or in drivers, including differential and single-ended re-drivers and drivers. Furthermore, while a BJT-based driver is shown in the example of FIG. 3, complimentary metal-oxide-semiconductor (CMOS) based drivers may also benefit from the use of the charge pump and NMOS transistor arrangement herein.

Thus, to the maximum extent allowed by law, the scope of the present invention is to be determined by the broadest permissible interpretation of the following claims and their equivalents, and shall not be restricted by the forgoing detailed description.

The invention claimed is:

1. A driver circuit comprising:
   an output terminal adapted for driving a data signal through a coupling capacitor to an external device;
   a first transistor including a first terminal connected to the output terminal, a second terminal coupled to a negative terminal of a voltage supply operable to provide a supply voltage, and a third terminal for receiving the data signal;
   an N-type metal-oxide semiconductor (NMOS) transistor having a first terminal connected to a positive terminal of the voltage supply, a second terminal coupled to the output terminal through a termination resistor, a gate terminal, and a bulk terminal connected to the negative terminal of the voltage supply; and
   a charge pump circuit having an output connected to the gate terminal of the NMOS transistor and operable to provide a first voltage higher than that of the voltage supply to activate the NMOS transistor in a first active mode, and, responsive to detecting a ramp-down of the supply voltage associated with a second non-active mode, transition to providing the supply voltage to the NMOS transistor gate terminal.

2. The driver circuit of claim 1, wherein the driver circuit is operable to reduce voltage variations coupled through the coupling capacitor during ramp down of the supply voltage at a supply voltage of 1.8V to less than 300 mV.

3. The driver circuit of claim 1, wherein the first transistor is a bipolar junction transistor (BJT) coupled to the negative terminal of the voltage supply through a constant current source.

4. The driver circuit of claim 1, wherein the driver circuit is embodied in an output driver of a re-driver circuit.

5. The driver circuit of claim 1, wherein the charge pump circuit further comprises:
   a charge pump operable to create the first voltage;
   a voltage comparator including a first input receiving a reference voltage, a second input receiving a voltage proportional to the supply voltage, and an output; and
   a digital control circuit having an input coupled to the output of the voltage comparator, and operable to cause the charge pump circuit to provide one of the first voltage or the supply voltage to the charge pump circuit output.

6. The driver circuit of claim 5, wherein the driver circuit is adapted to provide digital signaling at a rate of at least 5 Gbps.

7. A re-driver embodied on an integrated circuit, comprising:
   a plurality of receivers for receiving respective digital signals; and
   a plurality of driver circuits for applying the digital signals to respective outputs at a supply voltage, each driver circuit comprising:
      an output terminal adapted for driving a data signal through a coupling capacitor to an external device;
      a first transistor including a first terminal connected to the output terminal, a second terminal coupled to a negative terminal of a voltage supply operable to provide the supply voltage, and a third terminal for receiving the data signal; and an N-type metal-oxide semiconductor (NMOS) transistor having a first terminal connected to a positive terminal of the voltage supply, a second terminal coupled to the output terminal through a termination resistor, a gate terminal, and a bulk terminal connected to the negative terminal of the voltage supply; and a charge pump circuit having an output connected to the gate terminals of the respective NMOS transistors of the plurality of driver circuits and operable to provide a first voltage higher than that of the voltage supply to activate the respective NMOS transistor in a first active mode, and, responsive to detecting a ramp-down of the supply voltage associated with a second non-active mode, transition to providing the supply voltage to the respective NMOS transistor gate terminal.

8. The re-driver of claim 7, wherein the driver circuit is operable to reduce voltage variations coupled through the coupling capacitor during ramp down of the supply voltage at a supply voltage of 1.8V to less than 300 mV.

9. The re-driver of claim 7, wherein the first transistor is a bipolar junction transistor (BJT) coupled to the negative terminal of the voltage supply through a constant current source.

10. The re-driver of claim 7, wherein the charge pump circuit further comprises:

a charge pump operable to create the first voltage;

a voltage comparator including a first input receiving a reference voltage, a second input receiving a voltage proportional to the supply voltage, and an output; and a digital control circuit having an input coupled to the output of the voltage comparator, and operable to cause the charge pump circuit to provide one of the first voltage or the supply voltage to the charge pump circuit output.

11. The re-driver of claim 7, wherein the driver circuit is adapted to provide digital signaling at a rate of at least 5 Gbps.

12. A method of driving a digital signal through a coupling capacitor to a receiving circuit using a supply voltage provided by a voltage supply, the method comprising:

connecting a bulk terminal of an N-type metal-oxide semiconductor (NMOS) transistor to a negative terminal of the voltage supply;

in a first active mode, creating a first voltage higher than the supply voltage and applying the first voltage to a gate of the NMOS transistor to supply power to a first transistor;

driving the digital signal at the supply voltage with the first transistor to a terminal and through the coupling capacitor to an external circuit;

responsive to detecting a ramp-down of the supply voltage associated with a second non-active mode, transitioning the first voltage applied to the gate of the NMOS transistor toward the supply voltage.

13. The method of claim 12, further comprising limiting voltage variations coupled through the coupling capacitor during ramp down of the supply voltage at a supply voltage of 1.8V to less than 300 mV.

14. The method of claim 12, wherein the first transistor is a bipolar junction transistor (BJT) coupled to the negative terminal of the voltage supply through a constant current source.

15. The method of claim 12, wherein the first voltage is created with a charge pump.

16. The method of claim 15, wherein transitioning the first voltage toward the supply voltage includes deactivating the charge pump such that its output transitions toward the supply voltage.

17. The method of claim 12, further comprising level shifting a digital control signal for the gate of the NMOS transistor from the supply voltage to the first voltage.

18. The method of claim 17, further comprising feeding the level-shifted digital control signal to a buffer supplied with the first voltage, and feeding the output of the buffer to the gate of the NMOS transistor.

19. The method of claim 12, wherein the digital signal has a data rate of at least 5 Gbps.

20. The method of claim 12, wherein the receiving circuit is a sink device having a receiver circuit supplied with a lower voltage than the supply voltage at which the digital signal is driven.

* * * * *